United States Patent [19]

Pitasi

[11] Patent Number: 5,293,930
[45] Date of Patent: Mar. 15, 1994

[54] SURFACE-TO-AIR HEAT EXCHANGER FOR ELECTRONIC DEVICES

[75] Inventor: Martin J. Pitasi, Newbury, Mass.

[73] Assignee: Hewlett-Packard Company, Palo Alto, Calif.

[21] Appl. No.: 950,207

[22] Filed: Sep. 24, 1992

[51] Int. Cl.$^5$ .................................................. F28F 7/00
[52] U.S. Cl. .................................. 165/80.3; 165/185; 257/722; 361/382; 361/386; 361/689; 361/718
[58] Field of Search ............... 165/80.3, 185; 174/16.3; 257/713, 721, 722; 361/382, 383, 386, 388, 389

[56] References Cited

U.S. PATENT DOCUMENTS

| | | | |
|---|---|---|---|
| 3,241,605 | 3/1966 | Tabor | 257/722 |
| 4,340,902 | 7/1982 | Honda et al. | 257/722 |
| 4,345,267 | 8/1982 | Corman et al. | 361/382 |
| 4,607,685 | 8/1986 | Mitchell, Jr. | 165/80.3 |
| 4,716,494 | 12/1987 | Bright et al. | 361/386 |
| 4,745,456 | 5/1988 | Clemens | 361/386 |
| 4,804,172 | 2/1989 | Sokolovsky et al. | 165/80.3 |
| 5,019,940 | 5/1991 | Clemens | 361/386 |
| 5,132,875 | 7/1992 | Plesinger | 361/386 |

FOREIGN PATENT DOCUMENTS 435155  7/1991  European Pat. Off. ............ 361/386

*Primary Examiner*—John Rivell
*Assistant Examiner*—L. R. Leo

[57] ABSTRACT

A heat exchanger for cooling an electronic device combines material, geometry and fin effectiveness to maximize heat transfer rate for a its heat exchanging surface area. The heat exchanger comprises a thermally conductive spacer adapted to be mounted onto a surface of the electronic device. A thermally conductive disk-shaped fin is centered on the spacer and has opposed surface-to-air heat exchanging surfaces extending radially from the spacer generally parallel to the surface of the device. The spacer can be disk-shaped and has a diameter which is less than the diameter of the thermally conductive disk. As such, the heat exchanger is omnidirectional in that it effectively removes heat from the electronic device for an incoming air flow originating from any direction and flowing generally parallel to the surface of the device.

21 Claims, 5 Drawing Sheets

SURFACE-TO-AIR HEAT EXCHANGER FOR ELECTRONIC DEVICES

BACKGROUND OF THE INVENTION

Heat exchangers are commonly used to effect the transfer of heat from a warm object to a cooler external environment. In the field of electronics, heat exchangers are typically employed with electronic devices for removing heat generated within the devices. For example, a typical prior art heat exchanger has a horizontal base and a plurality of rectangular fins extending orthogonally relative to the base and can be used to remove heat from an electronic device. The heat exchanger is mounted onto an electronic device such that heat is conducted through the base and fins and dissipated into the surrounding environment by convection.

SUMMARY OF THE INVENTION

With existing heat exchangers the direction of the cooling air flowing across the device should be known prior to mounting the heat exchanger onto the device. To effectively remove heat from the device, the heat exchanger should be positioned such that the fins are generally parallel to the direction of the cooling air flow. The present invention is directed to a versatile surface-to-air heat exchanger of high thermal efficiency which overcomes that limitation of existing heat exchanging devices while providing an improved heat transfer rate. In a preferred embodiment, the heat exchanger comprises a thermally conductive spacer adapted to be mounted onto a surface of an electronic device. A thermally conductive disk-shaped fin is centered on the spacer and has opposed circular surface-to-air heat exchanging surfaces extending radially from the spacer generally parallel to the surface of the device. The spacer is preferably circular and has a diameter which is less than the diameter of the thermally conductive disk. As such, the heat exchanger is omnidirectional in that it effectively removes heat from the device for an incoming air flow originating from any direction and flowing generally parallel to the surface of the device. Thus, the direction of the air flow need not be known prior to positioning the present invention on an electronic device.

The rate at which heat is transferred by a heat exchanger is determined by the combined effects of the convective (external) and conductive (internal) heat transfer coefficients. The convective heat transfer coefficient is inversely proportional to the boundary layer thickness associated with the heat exchanger external surfaces, while the conductive heat transfer coefficient is governed by the conductance of the heat exchanger structure.

A boundary layer is produced by air flowing along a heat exchanging surface. The air flowing in the vicinity of the surface is slowed down by viscous forces producing a semi-insulating boundary layer. The boundary layer increases in thickness along the length of the heat exchanging surface in the direction of air flow which leads to a diminishing heat transfer coefficient along the length of the surface. Conductance is related to the conductivity of the heat exchanger material and the geometry of the heat exchanger structure. Thermal resistance is inversely proportional to conductance. Selection of a low conductivity material and/or improper geometric structure causes low conductance which leads to significant and varying thermal resistance paths as well as internal thermal gradients which adversely affect heat transfer rate.

Fin effectiveness for a heat exchanger indicates the overall thermal efficiency (i.e., conductive and convective heat transfer efficiency) of a fin and is defined as the actual heat transfer rate divided by the amount of heat which would be transferred if the entire surface of the fin was at a uniform base temperature. Based on the above definition, fin effectiveness for a heat exchanger is proportional to its actual heat transfer rate and is thus affected by boundary layer thickness and conductance.

A typical heat exchanger has rectangular fins having a substantial length in the direction of the air flow which results in a boundary layer of increasing thickness along the length of each fin. As such, the heat transfer rate decreases along each fin which adversely affects the actual heat transfer rate for the heat exchanger. The non-uniform heat transfer rate along the fins combined with varying conductance to different portions of the fins results in thermal gradients along the surfaces of the rectangular fins. As such, the fin effectiveness for a typical heat exchanger is usually on the order of about 50-70%. Thus, additional heat transfer surface area (i.e. larger fins) is required to satisfy a particular heat transfer rate. The additional surface area translates into a heat exchanger having a relatively large cross-sectional envelope making it difficult to achieve high air flow velocities for a given air source.

A heat exchanger of the present invention combines geometry and material to maximize actual heat transfer rate for its heat exchanging surface area. The disk-shaped fin provides substantially circular heat exchanging surfaces which have a low effective length in the direction of the air flow. As such, the boundary layer thickness and associated non-uniform heat transfer rates along the heat exchanging surfaces are minimized. The material and geometry of the present invention also combine to provide a high conductance structure which further minimizes temperature gradients along its surfaces. The heat exchanger is preferably formed from a high thermal conductivity material such as aluminum or copper. The spacer has a cross-sectional area and a length dimensioned for maximizing the conductance of the thermal paths within the spacer. The fin is thin and substantially circular with a diameter dimensioned to ensure a high conductance thermal paths extending through the fin to all heat exchanging surfaces. A heat exchanger of the present invention has minimal thermal gradients across its heat exchanging surfaces (i.e. substantially isothermal surfaces) resulting in substantially uniform heat transfer from all heat exchanging surfaces. This substantially uniform heat transfer results in a maximized (actual) heat transfer rate for the given heat exchanging surface area and a resulting fin effectiveness on the order of 90-100%. The maximized actual heat transfer rate results in lower device operating temperatures for a given heat exchanging surface area.

Another aspect of the present invention is that it has a minimal cross-sectional envelope such that air flow velocities can be maximized for a given cooling source which in turn leads to a further increase in the heat transfer coefficient. Yet another aspect of the present invention is that additional alternating spacers and disk-shaped fins can be stacked onto the basic heat exchanger structure as required to satisfy a particular heat transfer rate requirement.

DETAILED DESCRIPTION OF THE PREFERRED EMBODIMENT

Figure 1:
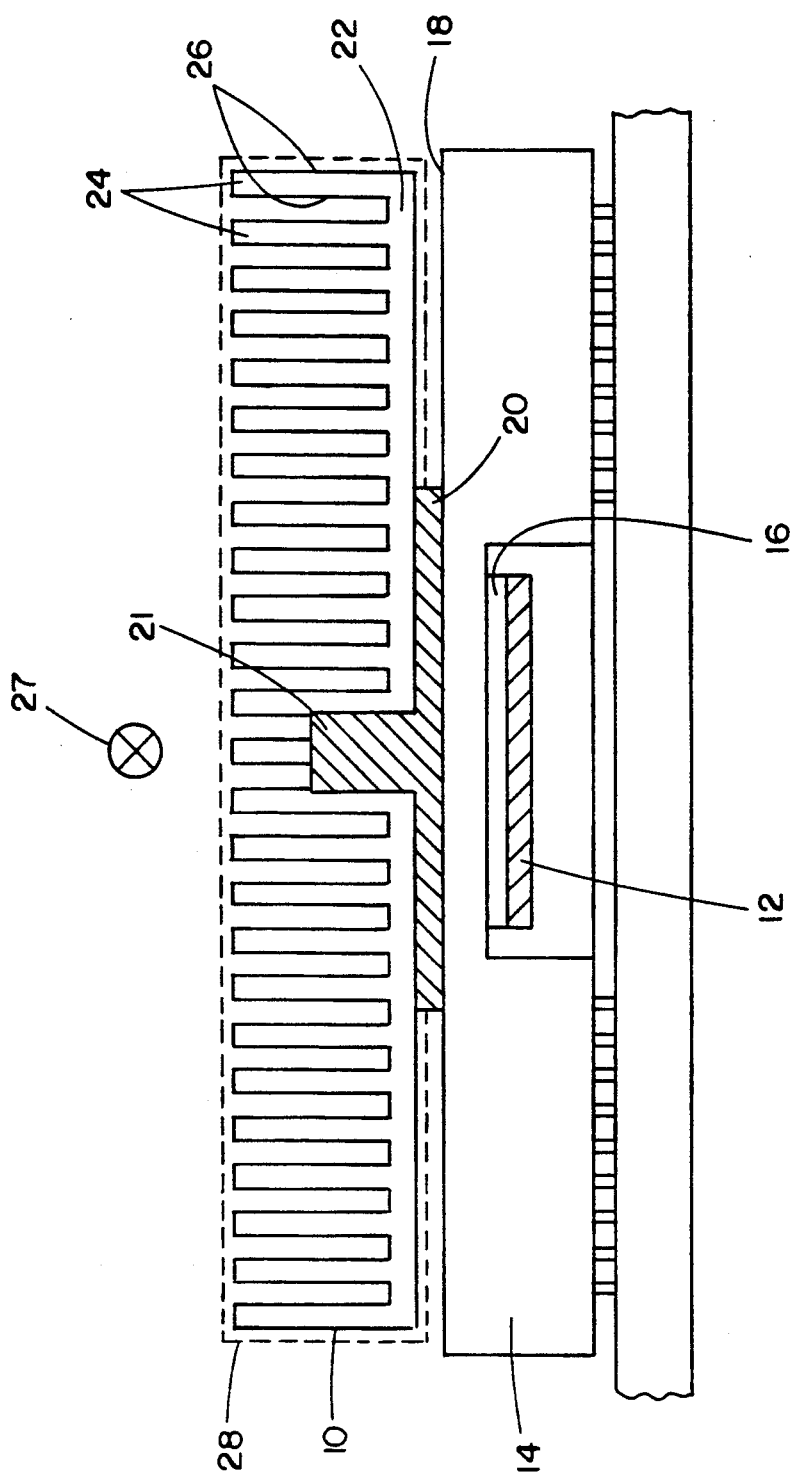
FIG. 1 is a cross-section view of a prior art heat exchanger positioned on an electronic device.

A prior art heat exchanger 10 for air cooling an electronic device 14 is shown in FIG. 1. The electronic device includes a heat generating electronic circuit chip 12 which is mounted into the package 14 with an epoxy adhesive 16. The heat exchanger 10 is positioned on an interface plate 20 located on an external surface 18 of the package. The plate 20 includes a stud 21 which extends from the plate and threads the heat exchanger such that it is centered on the plate in proximity to the chip 12.

The heat exchanger has a horizontal base 22 and a plurality of rectangular fins 24 extending orthogonally relative to the base. Each fin 24 has a pair of rectangular heat exchanging surfaces 26. Heat is conducted through the base 22 to the fins 24 and dissipated into the surrounding environment by convection.

As noted previously, various problems have been found in using the heat exchanger 10 in an electronics system. For example, the heat exchanger 10 should be oriented such that the fins 24 are parallel to the direction of the cooling air flow 27 to effectively remove heat from the package 14. Also, due to its substantial fin length in the direction of the air flow and its 50-70% fin effectiveness, the heat exchanger requires a substantial heat transfer surface area (i.e. large fins) to satisfy a required heat transfer rate.

Figure 2:
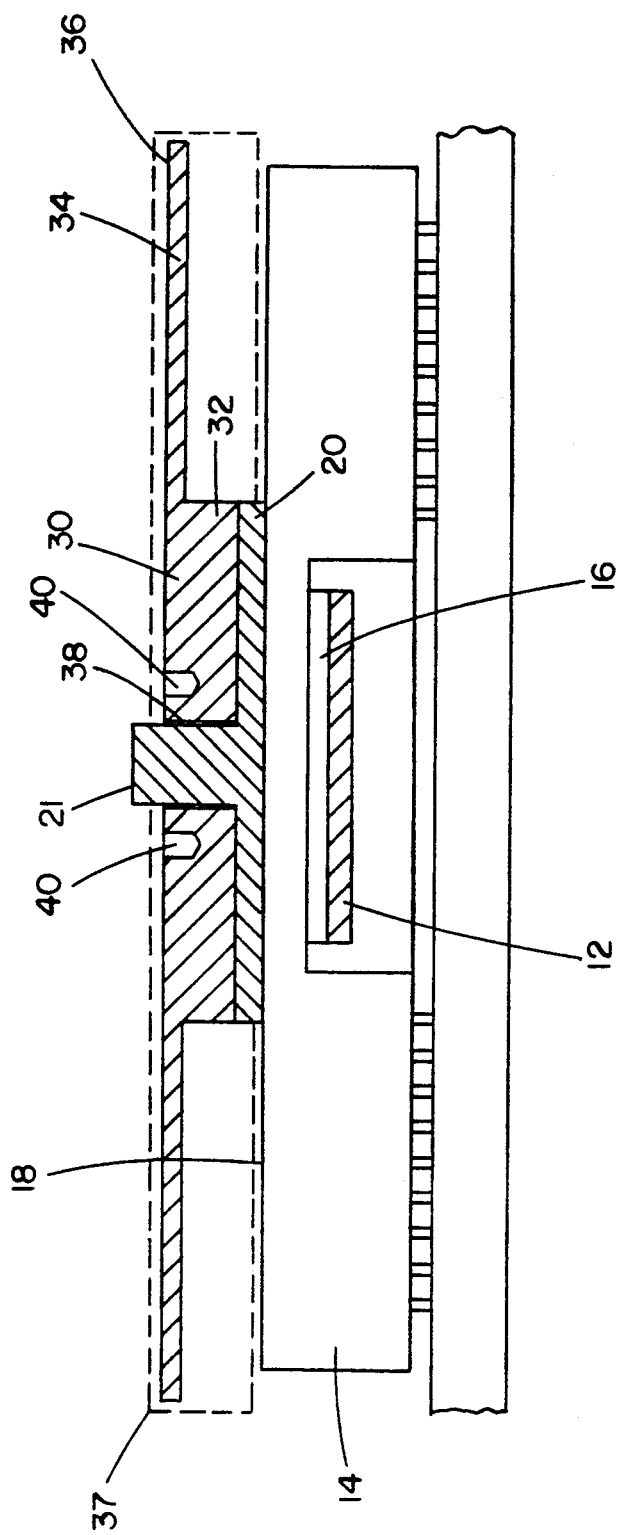
FIG. 2 is a cross-section view of a heat exchanger of the present invention positioned on an electronic device.

Referring to FIG. 2, the present invention combines material and geometry for providing a highly efficient and versatile surface-to-air heat exchanger 30 for cooling an electronic device. In a preferred embodiment, the heat exchanger 30 is adapted to cool the chip 12 and includes a thermally conductive spacer-disk 32 and a thermally conductive fin-disk 34 centered on the spacer-disk. The spacer-disk 32 has a diameter which is less than the diameter of the fin-disk 34. The fin-disk 34 has opposed circular surface-to-air heat exchanging surfaces 36 extending radially from the spacer-disk 32 generally parallel to the top surface 18 of the package 14. The heat exchanger 30 has a threaded hole 38 extending through its length such that it can be positioned on the package 14 in close proximity to the chip. To mount the heat exchanger onto the package 14, it is screwed onto the stud 21 until the spacer-disk 32 physically contacts the interface plate 20. Heat generated by the chip 12 is conducted through the spacer-disk 32 to the fin-disk 34 and dissipated into the surrounding environment by convection.

Figure 3:
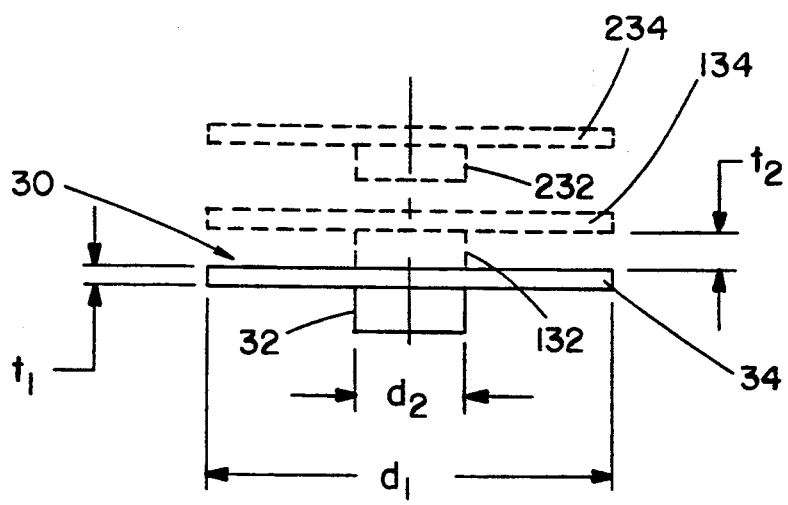
FIG. 3 is a cross-sectional view of a heat exchanger of the present invention with additional alternating spacer-disks and fin-disks stacked on the basic structure.

A pair of holes 40, formed in the top surface of the fin-disk 34, are required to adapt a special spanner tool for applying the proper torque during the heat exchanger installation. Simple modifications to the manufacturing process can be added allowing additional spacer-disks (132, 232) and the fin-disks (134, 234) to be integrated into the basic heat exchanger 30 (FIG. 3). As such, a heat exchanger can be tailored to satisfy any given heat transfer rate requirements.

Figure 4:
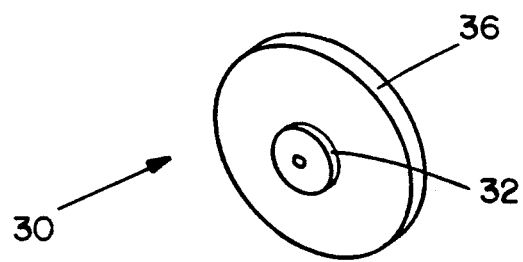
FIG. 4 is a perspective view of a heat exchanger of the present invention.

In accordance with one feature of the present invention, the heat exchanger 30 is formed of a pair of disks such that it is omnidirectional as shown in FIG. 4. As such, the direction of the incoming air flow need not be known prior to mounting the heat exchanger 30 onto an electronic device. Since it is omnidirectional, the heat exchanger 30 removes heat from a device with equal effectiveness regardless of the direction of the incoming cooling air flowing generally parallel to the surface of the device.

In accordance with another feature of the present invention, the circular edges of the heat exchanger disks are more aerodynamic than rectangular heat exchanging surfaces. The blunt edges of rectangular surfaces interfere with air flow which results in less air flowing over the heat exchanger and reduced heat transfer rates. In contrast, the smooth circular edges of the present invention cause minimal interference with the air flow thus allowing for greater heat transfer rates.

Yet another feature of the present invention is that the heat exchanger has a minimal cross-sectional envelope 37 such that air flow velocities can be maximized for a given cooling source. To that end, the heat exchanger can be placed in a small conduit or enclosure adjacent to a particular cooling source. Since the envelope of the enclosure is small, higher air velocities can be achieved for the particular cooling source.

Figure 5:
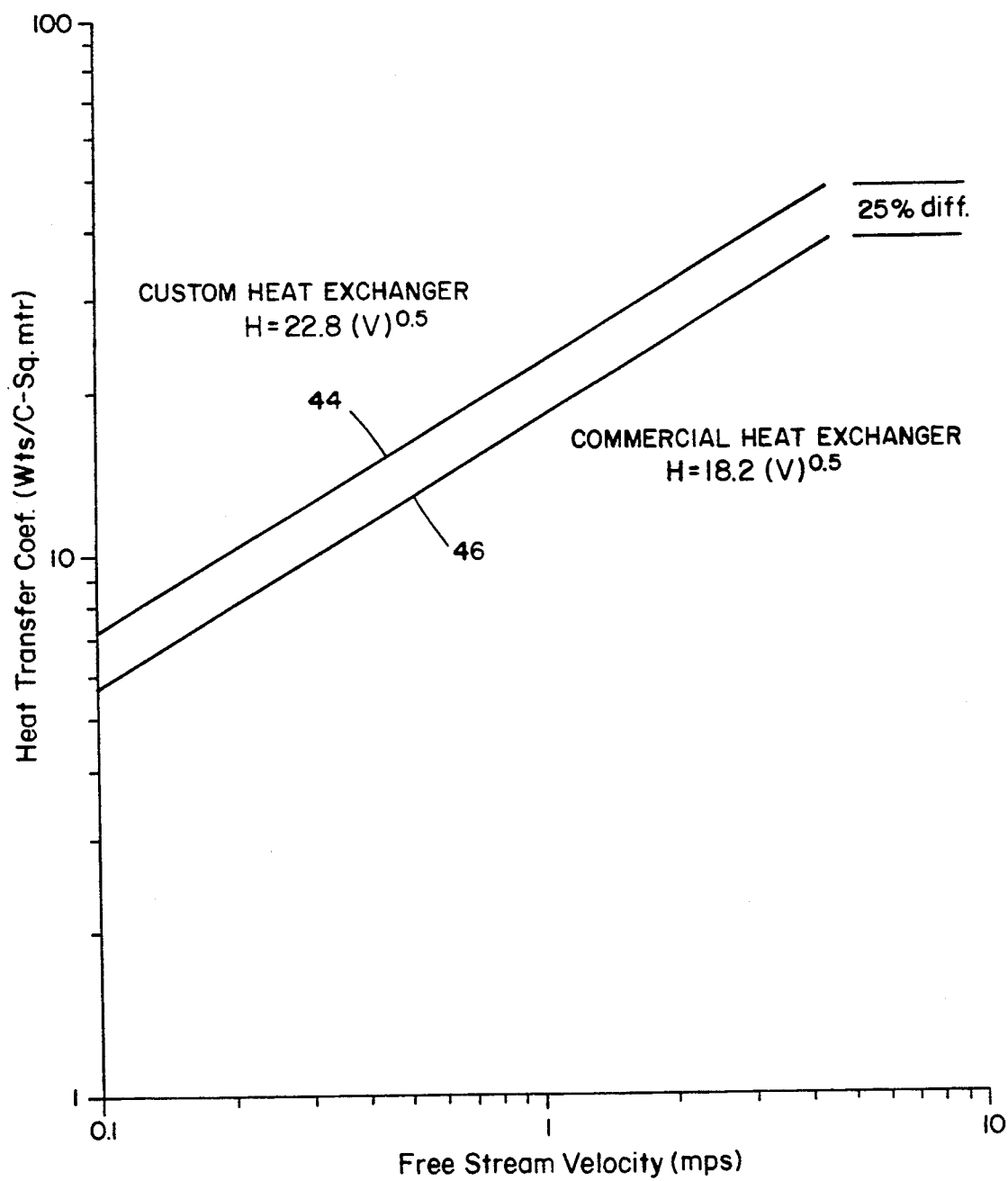
FIG. 5 is a graph illustrating heat transfer rate as a function of free stream velocity for the present invention and a prior art heat exchanger.

The present invention provides a significantly higher heat transfer rate than conventional heat exchangers for a given heat exchanging surface area. FIG. 5 provides a graphical illustration of heat transfer rate (or heat transfer coefficient) as a function of free stream air velocity for a pair of heat exchangers with equivalent overall heat exchanging surface areas. Significantly, the heat transfer rate 44 for the present invention is about 20-40% higher than the heat transfer rate 46 for the conventional heat exchanger of FIG. 1. As such, the present invention can maintain lower chip operating temperatures for a given heat exchanging surface area than conventional heat exchangers.

As noted previously, heat transfer rate of a heat exchanger is inversely proportional to boundary layer thickness of the heat exchanging surfaces and is directly proportional to the conductance of the heat exchanger structure (see Principles of Heat Transfer, by Frank Kreith, International Textbook Company, 1965, pp. 61-63 and 263-269). To maximize heat transfer rate for its heat exchanging surface area, the present invention combines a minimized boundary layer thickness (by providing small effective length surfaces) and a high conductance structure (by providing a high conductivity material and an optimal geometry) to minimize thermal gradients along the heat exchanging surfaces. As such, the present invention provides substantially uniform heat transfer from all of its heat exchanging surfaces which results in a maximized heat transfer rate and a 90-100% fin effectiveness.

In general, heat transfer rate (H) for a heat exchanging surface is inversely proportional to boundary layer thickness (∂) of the surface:

$$H \alpha (1/\partial)^{\frac{1}{2}}. \quad (1)$$

The boundary layer is produced by air flowing along the heat exchanging surface. The air flowing in the vicinity of the surface is slowed down by viscous forces producing a semi-insulating region known as the boundary layer. The insulating boundary layer increases in thickness along the length of the heat exchanging surface in the direction of air flow resulting in diminishing heat transfer rates along the length of the surface. Thus, the boundary layer thickness (∂) is proportional to the length of the surface (L):

$$\partial \alpha L.tm \quad (2)$$

Combining equations 1 and 2, heat transfer rate is inversely proportional to the length (L):

$$H \alpha (1/L)^{\frac{1}{2}}. \quad (3)$$

Figure 6:
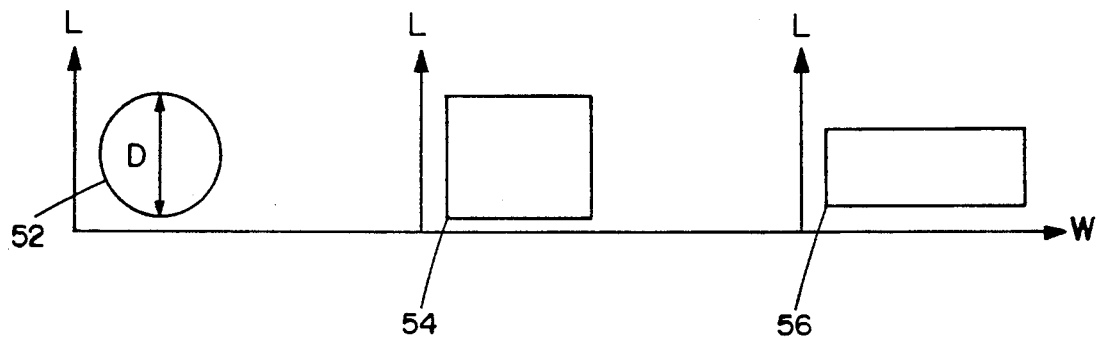
FIG. 6 is a top view of a circular fin-disk, a square fin-disk and a rectangular fin-disk.

Accordingly, to maximize the heat transfer rate (H), the length (L) should be minimized for a given heat exchanging surface area. The present invention provides a circular shaped heat exchanging surface which has a smaller effective length (L) than for an equivalent area square-shaped surface. For example, referring to FIG. 6, a substantially circular heat exchanging surface 52 has a diameter of 63.50 mm, an area of 3167 sq. mm and an effective length of 49.9 mm. A square surface 54 of equivalent area (3167 sq. mm) has an effective length of 56.4 mm. Assuming uniform temperature across each surface, the heat transfer rate of the circular surface 52 would be about 11% larger than the heat transfer rate of the square surface (see equation 2). However, the effective length is also affected by the spacer. The combined effects of the shape of the heat exchanging surface and the spacer caused the present invention to provide a heat transfer rate about 25% greater than a conventional rectangular heat exchanger. It is noted that a rectangular surface 56 having the same length (49.9 mm) as the effective length of the circular surface could be provided. To achieve this, a somewhat long width (about 63.5 mm) is required. For longer effective lengths, longer widths are required which leads to longer paths through the width. These longer thermal paths would in turn lead to excessive thermal gradients along the fin surface resulting in a lower fin effectiveness, thus reducing the overall heat transfer rate for the rectangular surface. Another problem with rectangular fins is that they are difficult to manufacture. As such, a rectangular finned device can be quite expensive.

The present invention utilizes a high conductivity material and an optimum geometry to maximize conductance. It is noted that conductance (C) can be calculated as follows:

$$C = (K)(A)/\Delta X \quad (4)$$

where
A = Cross-sectional area,
K = Material conductivity, and
ΔX = Thermal path length.

Figure 7:
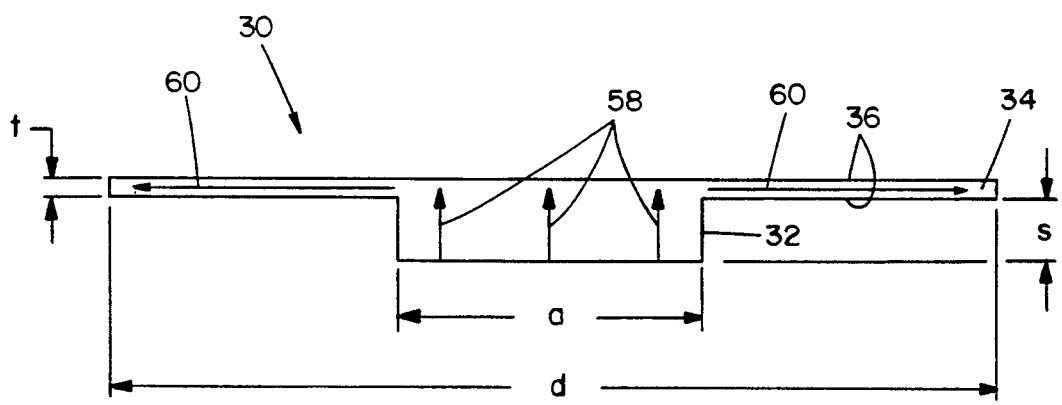
FIG. 7 is a cross-sectional view of the present invention illustrating the thermal paths through the heat exchanger.

Referring to FIG. 7, the heat exchanger 30 is a unitary structure formed from high thermal conductivity C14500 copper having a thermal conductivity of 205 BTU/hr/ft/° F. at 68° F. The spacer-disk 32 has a diameter (a) of about 20 mm or less and a height of about 5.6 mm or less for providing minimal conductance thermal paths 58 through the spacer-disk. The fin-disk has a thickness (t) of about 1.02 mm or less and substantially circular with a diameter (d) of about 70 mm or less for ensuring high conductivity thermal paths 60 extending radially through the fin-disk to the heat exchanging surfaces 36. It is noted that the minimum fin spacing (s) for the heat exchanger 30, as described for air velocities of 3 mps, is defined as:

$$s = (0.08)(d). \quad (5)$$

Providing fin spacing in accordance with equation 5 ensures uniform air flow across the heat exchanging surfaces 36 of the fin-disk 34.

In another embodiment, the heat exchanger 30 can be formed of 6061 aluminum having a thermal conductivity of 104 BTU/hr/ft/° F. at 68° F. The thermal conductivity of the aluminum material is about one-half that of the copper material, so the fin thickness of the heat exchanger should be doubled to 2 mm. The other dimensions of the heat exchanger are about the same as described above.

In either case, the above-described combination of circular shape, copper or aluminum material, fin dimensions and fin spacing minimizes thermal gradients across the surfaces of the heat exchanger resulting in a fin effectiveness on the order of 90–100%. As such, the fin is substantially isothermal and the heat transfer rate is maximized.

EQUIVALENTS

While the invention has been particularly shown and described with reference to a preferred embodiment thereof, it will be understood by those skilled in the art that various changes may be made without departing from the spirit and scope of the present invention as defined by the appended claims. For example, although the heat exchanging surfaces of the present invention have been described herein as substantially circular, it is noted that oval heat exchanging surfaces may be employed without departing from the scope of the invention.

I claim:

1. A heat exchanger for cooling an electronic device comprising:
   a high thermal conductivity spacer extending from a surface of the electronic device, the spacer having a diameter that is less than about 20 mm and a height S that is less than about 5 mm; and
   a high thermal conductivity disk having a diameter d centered on the spacer having opposed surface-to-air heat exchanging surfaces extending radially from the spacer generally parallel to the surface of the device, the height S of the spacer and the diameter d of the disk being proportioned relative to each other such that the ratio of S/d is about 0.08.

2. A heat exchanger as claimed in claim 1 further comprising alternating additional spacers and additional disks centered on said thermally conductive disk, the additional disks having opposed surface-to-air heat exchanging surfaces extending radially from the spacer generally parallel to the surface of the device.

3. A heat exchanger as claimed in claim 1 wherein the heat exchanging surfaces are substantially circular.

4. A heat exchanger as claimed in claim 1 wherein the heat exchanger is a unitary structure formed of high thermal conductivity copper.

5. A heat exchanger as claimed in claim 1 wherein the heat exchanging surfaces of the disk are substantially isothermal.

6. A heat exchanger as claimed in claim 1 wherein the heat exchanger is adapted to cool the electronic device for any incoming air flow originating from any direction and flowing generally parallel to the surface of the device.

7. A heat exchanger as claimed in claim 1 wherein the heat exchanger is a unitary structure formed of high thermal conductivity aluminum.

8. A heat exchanger for cooling an integrated circuit chip positioned within an electronic device, the heat exchanger comprising:
 a high thermal conductivity spacer adapted to be mounted onto a surface of the electronic device adjacent to the chip, the spacer having a diameter that is less than about 20 mm and a height S that is less than about 5 mm; and
 a high thermal conductivity disk having a diameter d located on the spacer, the disk having a diameter which is greater than a diameter of the spacer for providing opposed surface-to-air heat exchanging surfaces extending radially from the spacer, the disk and spacer being aligned along a common axis extending through centers of said disk and spacer, the axis being generally orthogonal to the heat exchanging surfaces of the disk, the height S of the spacer and the diameter d of the disk being proportioned relative to each other such that the ratio of S/d is about 0.08.

9. A heat exchanger as claimed in claim 8 further comprising alternating additional spacers and additional disks stacked over said thermally conductive disk, the additional spacers and disks being aligned along the common axis which extends through centers of the additional spacers and disks.

10. A heat exchanger as claimed in claim 8 wherein the heat exchanging surfaces of the disk are generally parallel to the surfaces of the device.

11. A heat exchanger as claimed in claim 8 wherein the heat exchanger is a unitary structure formed of high thermal conductivity copper.

12. A heat exchanger as claimed in claim 8 wherein the heat exchanging surfaces of the disk are substantially isothermal.

13. A heat exchanger as claimed in claim 8 wherein the heat exchanger is adapted to cool the electronic device for an incoming air flow originating from any direction and flowing generally parallel to the heat exchanging surfaces.

14. A heat exchanger as claimed in claim 8 wherein the heat exchanging surfaces are substantially circular.

15. A heat exchanger as claimed in claim 8 wherein the diameter of the disk is less than about 70 mm.

16. A heat exchanger as claimed in claim 11 wherein the thickness of the disk is about 1 mm.

17. A heat exchanger as claimed in claim 8 wherein the heat exchanger is a unitary structure formed of high thermal conductivity aluminum.

18. A heat exchanger as claimed in claim 17 wherein the thickness of the disk is about 2 mm.

19. An omnidirectional heat exchanger for cooling an electronic device in conjunction with cooling air flow originating from any direction and flowing across the electronic device, the heat exchanger comprising:
 a disk-shaped high thermal conductivity spacer positioned on a surface of the electronic device adjacent to the chip, the spacer having a diameter that is less than about 20 mm and a height S that is less than about 5 mm; and
 a high thermal conductivity disk having a diameter d centered on the spacer such that the disk and spacer are disposed along a common axis extending through centers of said disk and spacer, the common axis being generally orthogonal to the surface of the device, the disk having a diameter which is greater than a diameter of the spacer for providing opposed substantially circular surface-to-air heat exchanging surfaces extending radially from the spacer generally parallel to the device, the height S of the spacer and the diameter d of the disk being proportioned relative to each other such that the ratio of S/d is about 0.08.

20. A method of cooling an electronic device comprising:
 positioning a high thermal conductivity spacer on a surface of the electronic device, the spacer having a diameter that is less than about 20 mm and a height S that is less than about 5 mm; and
 centering a high thermal conductivity disk having a diameter d on the spacer, the disk having opposed surface-to-air heat exchanging surfaces extending radially from the spacer generally parallel to the surface of the device, the height S of the spacer and the diameter d of the disk being proportioned relative to each other such that the ratio of S/d is about 0.08.

21. A method of fabricating a heat exchanger adapted for cooling an electronic device comprising:
 providing a high thermal conductivity material;
 removing a first portion of the material to form a spacer adapted to be mounted onto a surface of the electronic device, the spacer having a diameter that is less than about 20 mm and a height S that is less than about 5 mm; and
 removing a second portion of the material to form a disk having a diameter d and having opposed surface-to-air heat exchanging surfaces extending radially from the spacer generally parallel to the surface of the device, the height S of the spacer and the diameter d of the disk being proportioned relative to each other such that the ratio of S/d is about 0.08.

* * * * *